United States Patent [19]
Earl

[11] Patent Number: 6,064,226
[45] Date of Patent: May 16, 2000

[54] MULTIPLE INPUT/OUTPUT LEVEL INTERFACE INPUT RECEIVER

[75] Inventor: Jeffrey S. Earl, San Jose, Calif.

[73] Assignee: Vanguard International Semiconductor Corporation, Hsinchu, Taiwan

[21] Appl. No.: 09/044,198

[22] Filed: Mar. 17, 1998

[51] Int. Cl.[7] .............................................. H03K 19/0185
[52] U.S. Cl. .............................. 326/68; 326/50; 326/71; 327/74; 327/333
[58] Field of Search ................................. 326/68, 80–81, 326/83, 86, 121, 26–27, 49–50, 70–71, 17; 327/333, 74, 77, 52–53

[56] References Cited

U.S. PATENT DOCUMENTS

| | | | |
|---|---|---|---|
| 4,626,713 | 12/1986 | Lee | 327/77 |
| 4,849,661 | 7/1989 | Bazes | 327/77 |
| 5,111,080 | 5/1992 | Mizukami et al. | 326/83 |
| 5,311,083 | 5/1994 | Wanlass | 326/68 |
| 5,438,281 | 8/1995 | Takahashi et al. | 326/86 |
| 5,936,429 | 8/1999 | Tomita | 326/26 |

*Primary Examiner*—Jon Santamauro
*Attorney, Agent, or Firm*—Christensen O'Connor Johnson & Kindness PLLC

[57] ABSTRACT

The present invention provides an input receiver in a differential amplifier or modified differential amplifier configuration which adjusts the input high and low voltage signals compatible with multiple input/output (I/O) interfaces, including transistor-transistor logic (TTL), Low Voltage TTL (LVTTL), and Stub Series Terminated Logic (SSTL) interfaces. Transistors in a differential amplifier or modified differential amplifier configuration that receive a reference_voltage signal and receiver_enable signal are adjusted in accordance to the input high signal and input low signal requirements for a selected type of interface, while other transistors remain at a relatively constant voltage. Once a particular type of interface has been selected, the gate voltages for the transistors that receive the reference_voltage and receiver_enable signals remain relatively constant. The switching speed of an input receiver is not adversely affected by the additional load of non-operational FETs for one or more of the I/O interface types due to the supply of constant gate voltages to the transistors.

25 Claims, 5 Drawing Sheets

MULTIPLE INPUT/OUTPUT LEVEL INTERFACE INPUT RECEIVER

FIELD OF THE INVENTION

The present invention relates generally to integrated circuits, and more particularly, to an input receiver for interfacing with multiple input/output level interfaces.

BACKGROUND OF THE INVENTION

Several input/output (I/O) level interfaces are available to a chip designer to select from in designing an integrated circuit that is operable with an external chip. Choices in the selection of various I/O level interfaces raise the possibility of incompatibility problems in voltage signal handshakes between different semiconductor chips. Several types of I/O level interfaces are available on the market which include transistor-transistor logic (TTL), Low Voltage TTL (LVTTL), and Stub Series Terminated Logic (SSTL) interfaces.

A conventional solution to solve incompatible I/O interfaces between multiple chips is to design an integrated circuit that contains multiple I/O interfaces such that each interface within the integrated circuit operates to communicate with a particular type of I/O level interface. This solution is cumbersome and inefficient. The overall dimension of a die increases due to the additional circuitry required for a separate and dedicated interface for each type of I/O level interface. A larger die increases the manufacturing costs, the cost to distributors, as well as reduces sales. Secondly, this design requires a multiplexer to select from one of the I/O level interfaces, which enlarges the circuitry and adds additional delay. The speed penalty imposed from the added delay of the multiplexer produces a speed path which is inefficient. Although the speed penalty of the multiplexer can be overcome by manufacturing each I/O interface on a separate metal mask, the separate metal mask adds to the total manufacturing costs. Separate metal masks also impose on the selection of a particular type I/O level interface during the early stages of a chip design to ensure the manufacturing feasibility once the chip is ready for mass production.

Another conventional solution implements an input receiver by adding or removing field-effect-transistors (FET) as needed for a particular type of I/O level interface. The type of interface TTL, LVTTL, or SSTL, will dictate the number and/or sizes of the FET transistors inserted or removed in the input receiver. The additional FET transistors are placed either in series or in parallel with the existing circuitry in an input receiver in order to achieve the necessary voltage requirements for a particular type of I/O level interface. A drawback of this approach is that the switching speed of an input receiver can be negatively impacted when some of the FET transistors are not operational in the input receiver.

A further solution implements an input receiver in a ratio logic configuration as shown in FIG. 1. A ratio logic input receiver 1 includes a P-channel FET (PFET) transistor 2 coupled in series to a NFET transistor 3 in an inverter-like structure. The trip point of the ratio logic input receiver 1 is determined from a Vdd voltage. A trip or switching point represents a voltage level where an input receiver will recognize an input signal as a high signal or a low signal. The trip point in the ratio logic input receiver 1 can be tuned and adjusted by changing the sizes of the PFET transistor 2 and NFET transistor 3. A short-coming of the ratio logic input receiver 1 is that the trip point can fluctuate widely between high and low Vdd voltages. The wide swing in receiver switch point between high and low Vdd voltages deters a chip designer from using the ratio logic input receiver 1 for fast speed devices and renders the utilization of the ratio input logic receiver 1 more suitable for slower speed devices.

Accordingly, it is desirable to have an input receiver capable of communicating with multiple I/O level interfaces at fast speed and lower cost.

SUMMARY OF THE INVENTION

The present invention overcomes the foregoing limitations by providing an input receiver in a differential amplifier or modified differential amplifier configuration which adjusts the input high and low voltage signals compatible for multiple I/O level interfaces, including a LVTTL, STTL, or TTL interface. Transistors in a differential amplifier or modified differential amplifier configuration that receive a reference_voltage signal and receiver_enable signal are adjusted in accordance to the input high and input low voltage requirements for a selected type of I/O interface, while other transistors remain at a relatively constant voltage. Once a particular type of I/O interface has been selected, the gate voltages for the transistors that receive the reference_voltage and receiver_enable signals also remain relatively constant. The switching speed of an input receiver is not adversely affected by the additional load of non-operational FETs for one or more of the I/O interface types due to the supply of constant voltages to the gates of the transistors.

An input receiver, comprising: (1) first means for receiving first and second reference voltage signals, the first reference voltage signal being at an intermediate level to the first means for interfacing with a first interface if the input receiver interfaces with the first interface, the second reference voltage signal being at an intermediate level to the first means for interfacing with a second interface if the input receiver interfaces with the second interface, the first interface having a first predetermined input high voltage signal and a first predetermined input low voltage signal, the second interface having a second predetermined input high voltage signal and a second predetermined input low voltage signal; and (2) second means, operatively connected to reference voltage signals means, for receiving an enable signal and an interface select signal, the enable signal being high to the second means for enabling the input receiver during normal operation, the interface select signal selecting a first state if the input receiver interfaces with the first interface and selecting a second state if the input receiver interfaces with the second interface.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
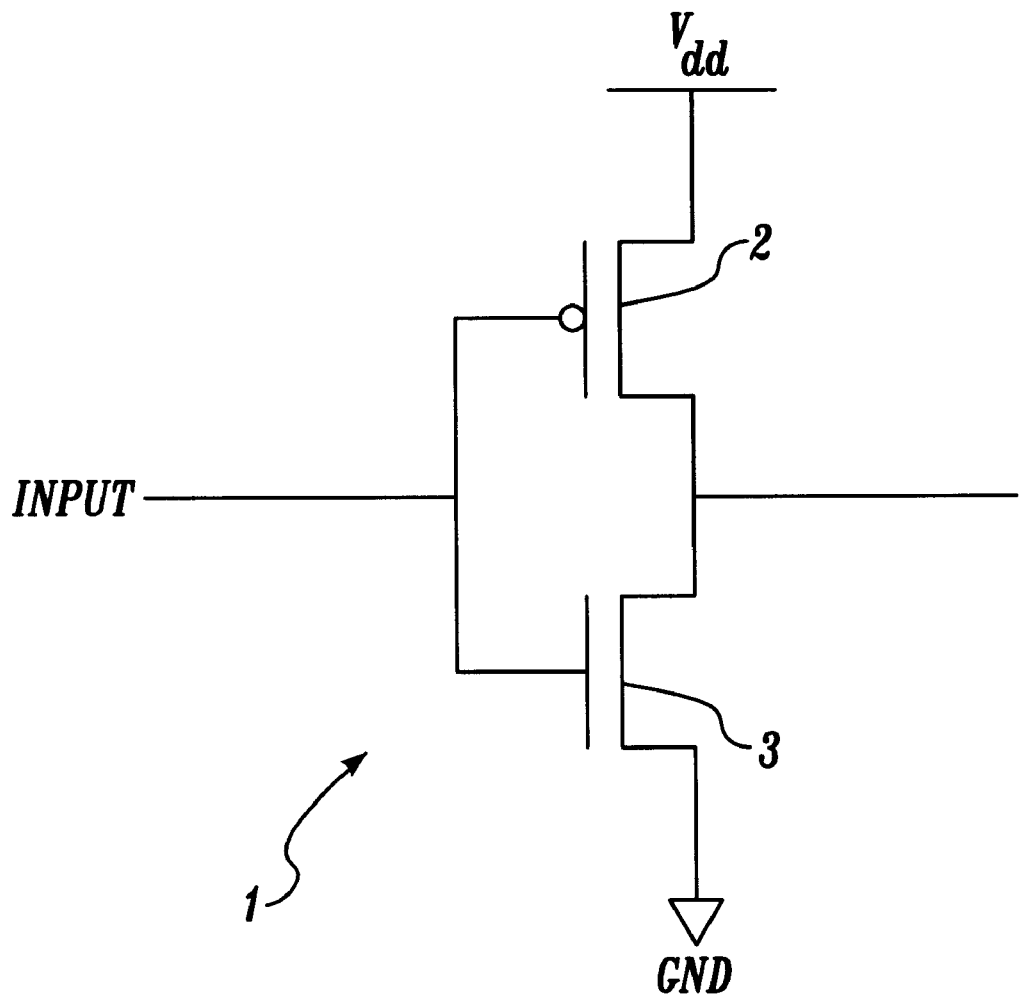
FIG. 1 is a prior art schematic diagram of a ratio logic input receiver.
Figure 2:
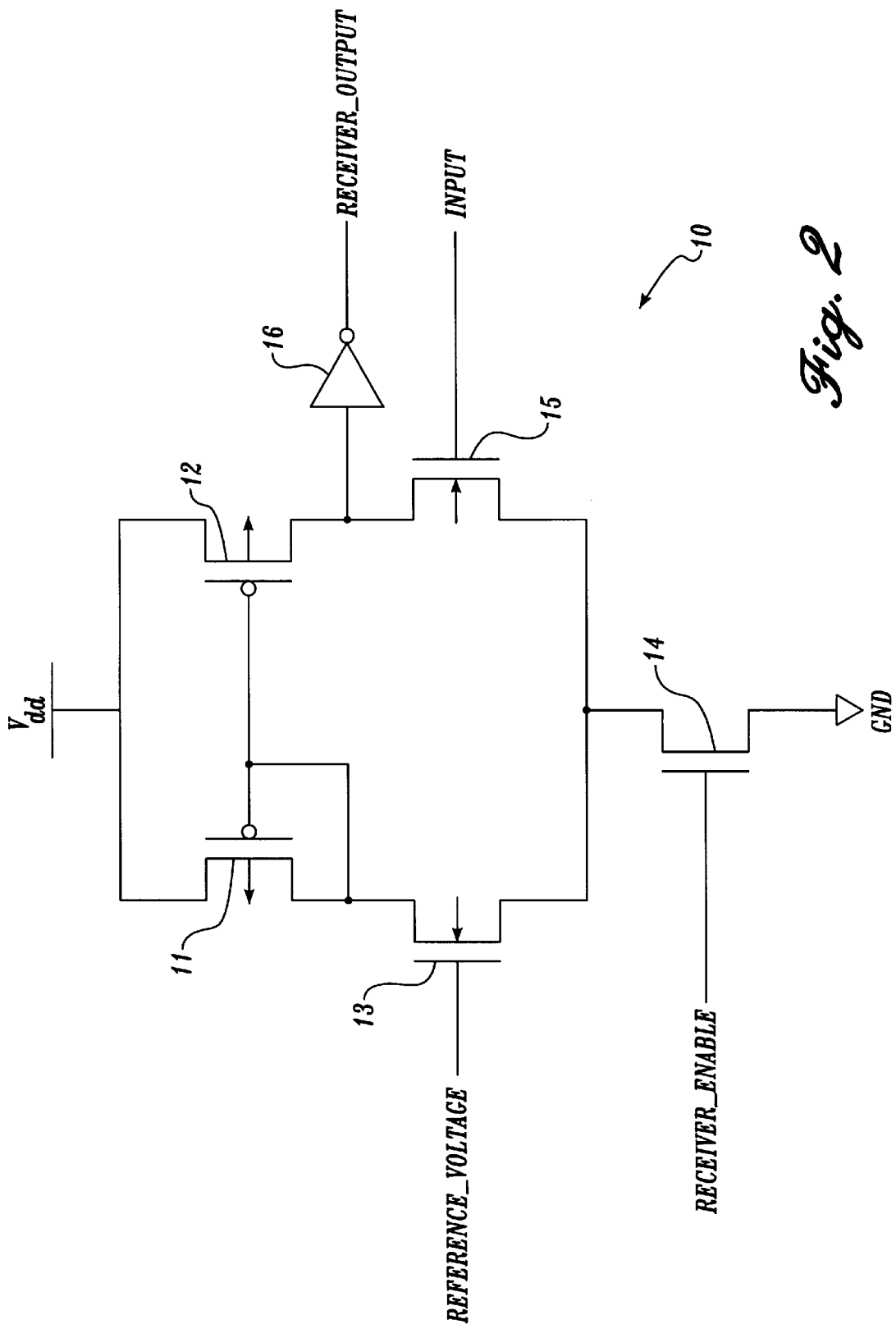
FIG. 2 is a schematic diagram of an input receiver in a differential amplifier configuration for a single interface formed in accordance with the present invention.

FIG. 2 is a schematic diagram of an input receiver in a differential amplifier configuration for a single interface in the present invention. The input receiver 10 includes P-channel field-effect-transistors (PFETs) 11–12 and N-channel FETs (NFETs) 13–15, and an inverter 16. The PFET 11 has a source connected to a Vdd voltage, a gate, and a drain connected to the gate. The PFET 12 has a source connected to the Vdd voltage, a gate connected to the gate and drain of the PFET 11, and a drain. The NFET 13 has a drain connected to the gate and drain of the PFET 11, a gate for receiving a reference voltage signal and a source. The NFET 14 has a drain connected to the source of the NFET 13, a gate for receiving a receiver_enable signal, and a source connected to a ground. The NFET 15 has a drain connected to the drain of the PFET 12, a gate for receiving an input signal, and a source connected to the source of the NFET 13 and the drain of the NFET 14. The inverter 16 has an input connected to the drain of the PFET 12 and the drain of the NFET 15, and an output for generating a receiver_output signal.

A trip point in an input signal of the input receiver 10 is determined relative to the level of the reference_voltage. The PFET 12 and NFET 15 are designed to accommodate the multiple receiver type characteristics. The NFETs 13 and 14 are adjusted to tailor the bias voltage on PFET 12 and the Idd voltage through the receiver. However, once the particular type of interface is selected, the gate voltages on the NFETs 13 and 14 are maintained at a relatively constant voltage. The switching speed of the input receiver 10 is also not adversely affected by having the additional load of non-operational FETs in one or more of the interface types. The PFETs 11 and 12 are biased at a constant voltage. NFET 13 is always partially ON due to the constant voltage generated by the reference_voltage signal. NFET 14 is always ON due to the constant voltage generated by the receiver_enable signal. The NFET 15 will turn ON or OFF depending on the voltage level of the input signal. Since the reference_voltage is always at an intermediate voltage level, NFET 13 is always partially ON with the current being pulled down through NFET 14. The intermediate voltage level preferably is near the mid-point of high and low input signal levels. Even if the input signal is at 0 volts at the gate of the NFET 15, which turns OFF the gate of the NFET 15, some electrical current will still be flowing through the path formed by the NFETs 13 and 14.

The PFETs 11 and 12, and NFETs 13–15 typically have different transistor sizes. Suppose the PFET 11 and NFET 13 formed the first leg of the input receiver 10 while the PFET 12 and NFET 15 formed the second leg of the input receiver 10, if the first and second legs are identical where the size of the PFET 11 in the first leg is the same as the size in the PFET 12 in the second leg, and if the size of the NFET 13 in the first leg is the same as the size in the NFET 15 in the second leg, then the switching point for the input signal will resemble the amplitude of the reference_voltage signal. The current through each leg will also be identical. Practical circuit design considerations impose selecting a different size of PFETs and NFETs for first and second legs to achieve substantially identical high and low output transitions as well as to minimize the receiver current consumption. The output high transition, where the output changes from a low state to a high state in response to a change from a low state to a high state in the input signal, is preferred to be identical to an output low transition, where the output changes from a high state to a low state in response to a change from a high state to a low state in the input signal. To meet such a requirement, as well as to minimize the current through the receiver, the PFET 11 and NFET 13 are typically different in transistor sizes from the PFET 12 and NFET 15. Even though the switching point will differ in selecting different transistor sizes between the first and second legs, in comparison to using the same transistor sizes for both the first and second legs, the switching point will remain relatively constant for a particular type of I/O interface.

Figure 3A:
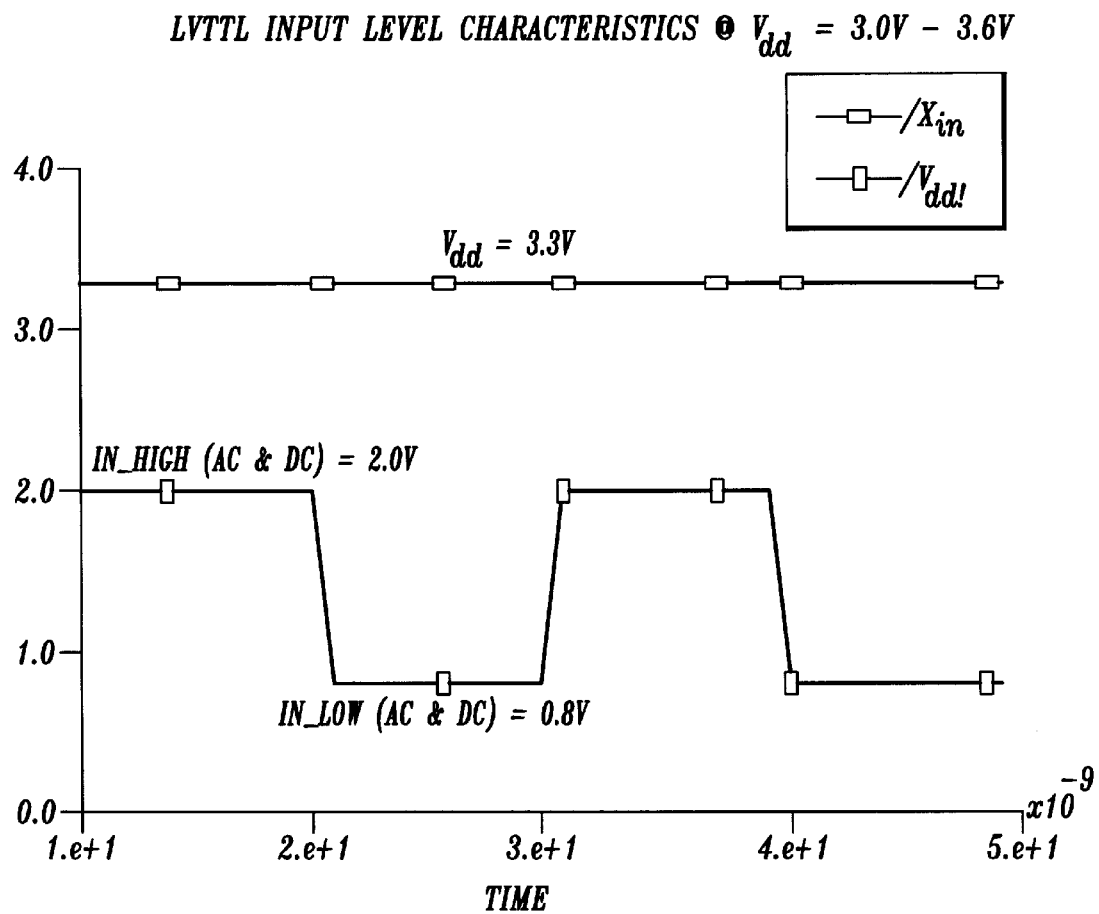
FIG. 3A is a graphical diagram of the signal characteristics in an LVTTL interface.

Referring now to FIG. 3A, there is shown a graphical diagram of the signal characteristics of an LVTTL interface. An LVTTL interface has a specification requirement that sets forth an input high signal, Vin high, at 2.0 volts, and an input low signal, Vin low, at 0.8 volt. The Vin high of 2.0 volts and the Vin low of 0.8 volt provide a voltage range within which a trip point should be selected for an LVTTL interface. To produce a reduced noise margin, the trip point is preferably selected near the middle spectrum. In other words, the trip point for an LVTTL interface is preferably set at 1.4 volts, which represents the midpoint between 2.0 volts and 0.8 volt. The Vin high at 2.0 volts sets a high threshold level in which the input signal must attain in order for the input receiver 10 to recognize the input signal as high. The Vin low at 0.8 volt sets a low threshold voltage level in which the input signal must fall under for the input receiver 10 to recognize the input signal as low. A trip point, if set at 1.4 volts for an LVTTL interface, serves as a bar in which the input receiver 10 must maintain in order to recognize a valid "1" if the voltage level is above the bar, or a valid "0" if the voltage level is less than the bar. Still, the input signal should clearly stay above the 2.0 volts set by the Vin high for the input receiver 10 to recognize a high signal and below 0.8 volt set by the Vin low for the input receiver 10 to recognize a low signal. If the amplitude of an input signal is at 1.5 volts, the data is in an indeterminate state. Therefore, the input signal should change between the Vin high and Vin low levels only during a signal transitioning such that the input signal should settle to a high signal or a low signal during non-signal-transitioning periods.

Figure 3B:
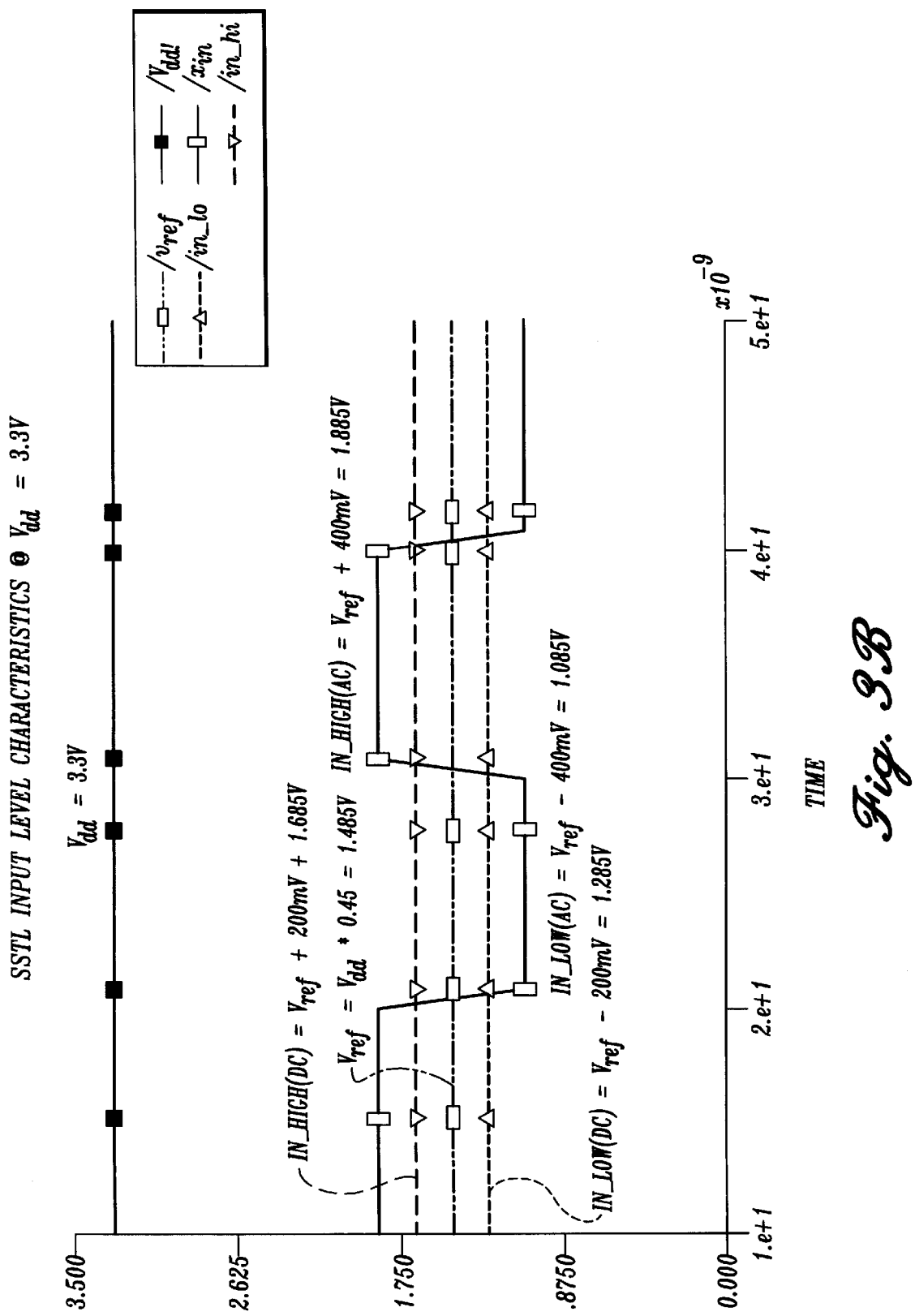
FIG. 3B is a graphical diagram of the signal characteristics in an SSTL interface.

Turning now to FIG. 3B, there is shown a graphical diagram of the signal characteristic of an SSTL interface. An SSTL interface has significantly less noise margin than an LVTTL interface because of the delta between an input high voltage level and an input low voltage level. While an LVTTL interface has a constant reference voltage (generated on chip) and constant input voltage signal levels which are independent of Vdd, the SSTL interface has an externally supplied reference voltage, Vref, and input voltage signal levels which are both dependent on the Vdd voltage. An SSTL interface defines two types of voltage levels, static (DC) and dynamic (AC). Under DC operations, the input receiver 10 recognizes a high voltage level at Vref +200 millivolts (mv) and a low voltage level at Vref −200 mv. The voltage swing between a high voltage level and a low voltage level is 400 mv, as determined from the high voltage level which is set at 200 mv above Vref and the low voltage signal which is set at 200 mv below Vref. Under AC operations, the input receiver 10 requires a high voltage level at Vref +400 mv and a low voltage level at Vref −400 mv. The additional 400 mv of noise margin over DC conditions allows for some ringing and noise on the input signal. Ringings and noises that fall within +200 mv of Vref can still be responded to by the input receiver 10, while ringings and noises of more than ±200 mv of Vref will be discounted. In actual implementation, the input receiver 10 is preferably designed with a trip point of ±50 mv from Vref to provide a safer margin of errors, although the specification sets the high and low signals at Vref±200 mv.

Suppose Vref is set to Vdd * 0.45 with a Vdd set at 3.3 volts, for DC input level characteristics, the input high signal is equal to Vref+200 mv, which computes to a numerical value of 1.685 volts. The input low signal is equal to Vref+200 mv, which totals to 1.285 volts. For AC input level characteristics, the input high signal is equal to Vref+400 mv, which computes to a numerical value of 1.885 volts. The input low signal is equal to Vref−400 mv, which totals to 1.085 volts.

TTL and LVTTL interfaces are simpler to interface to an input receiver than an SSTL interface since TTL and LVTTL interfaces have a trip point which does not depend on a Vdd voltage. The high voltage signal is set at 2.0 v (LVTTL) or 2.4 v (TTL) and the low voltage signal is set at 0.8 volt for LVTTL and TTL interfaces, irrespective of the Vdd voltage.

The switching levels between a high signal and a low signal represent a principal difference between an LVTTL interface and an SSTL interface. An SSTL interface is generally used for high speed parts that need to recognize a shorter pulse width. The selection of transistor sizes will also affect how fast a transition in which the input receiver 10 is able to recognize. However, an SSTL interface has an input signal which has a less noise margin than an LVTTL interface. The input signal is dependent on a reference voltage, where the reference voltage is dependent on a Vdd voltage that is supplied from an external source. The reference voltage is determined by multiplying the external Vdd voltage by 0.45.

Figure 4:
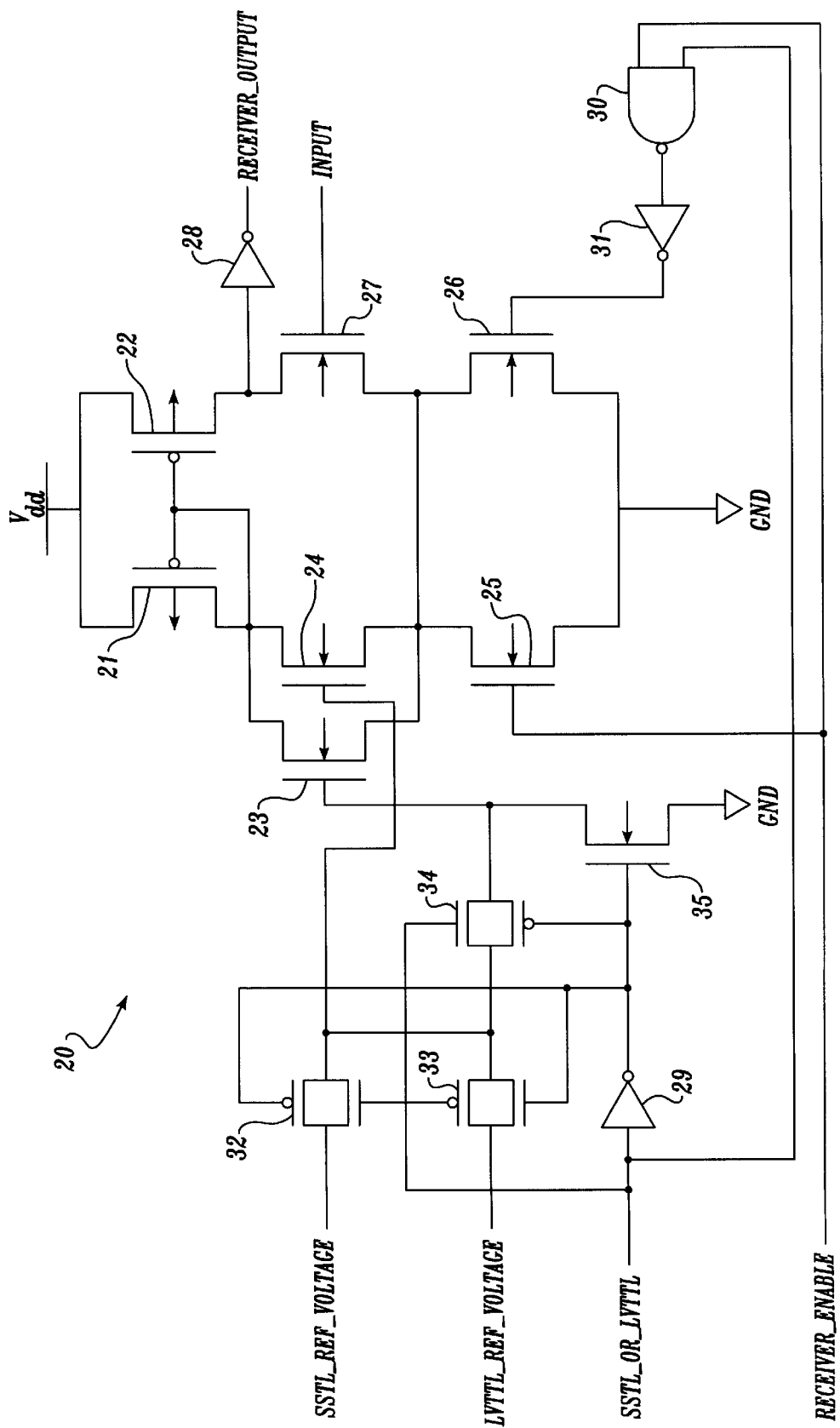
FIG. 4 is a schematic diagram of the input receiver in a modified differential amplifier configuration for multiple interfaces.

FIG. 4 shows a schematic diagram of an input receiver in a modified differential amplifier configuration for multiple interfaces. The input receiver 20 includes PFETs 21–22, NFETs 23–27, inverters 28–29, a NAND gate 30, an inverter 31, transmission gates 32–34, and a NFET 35. The PFET 21 has a source connected to a Vdd voltage, a gate and a drain connected to its gate. The PFET 22 has a source connected to the Vdd voltage, a gate, and a drain. The NFET 23 has a source, a gate, and a drain, where the gate of the NFET 23 is connected to the transmission gate 34 and the NFET 35. The NFET 24 has a source, a gate, and a drain, where the drain of the NFET 24 is connected to the gates of the PFETs 21 and 22, the drain of the PFET 21, and the drain of the NFET 23. The gate of the NFET 24 is connected to the transmission gate 32 for receiving a SSTL_ref_voltage signal. The gate of the NFET 24 is further connected to the transmission gate 33 for receiving a LVTTL_ref_voltage signal. The NFET 25 has a source, a gate for receiving a receiver_enable signal, and a drain. The NFET 26 has a drain, a gate, and a source connected to the source of the NFET 25 and a first ground. The NFET 27 has a source, a gate for receiving an input signal, and a drain, where the source of the NFET 27 is connected to the source of the NFET 23, the source of NFET 24, the drain of the NFET 25 and the drain of the NFET 26. The inverter 28 has an input connected to the drain of the PFET 22 and the drain of the NFET 27, and an output for generating a receiver_output signal. The inverter 29 has an input for receiving an SSTL_or_LVTTL signal, and an output. The NAND gate 30 has a first input for receiving the SSTL_or_LVTTL signal, a second input for receiving a receiver_enable signal, and an output. The inverter 31 has an input for receiving the output of the NAND gate 30 and an output connected to the gate of the NFET 26. The NFET 35 has a drain connected to the output of the transmission gate 34 and the gate of the NFET 23, a gate for connecting to the inverter 29, the transmission gates 32–34, and a source connected to a second ground.

The NFET 13 which dictates the reference_voltage signal in FIG. 2 is further divided into the NFETs 23 and 24 to meet the multiple voltage requirements for SSTL_3 and LVTTL interfaces. For an SSTL_3 interface in 3.3 volts under normal mode, the NFETs 23 and 24 are turned ON with the gates of the NFETs 23 and 24 connected to the SSTL_ref_voltage signal. For an LVTTL mode, the NFET 23 is turned OFF by connecting the gate of the NFET 23 to a ground while the NFET 24 is turned ON by connecting the gate of the NFET 24 to the LVTTL_ref_voltage signal. By turning off NFET 23, the voltage on the gate of PFET 22 is increased, slowing and lengthening the falling edge of the receiver_output signal, as well as reducing the overall power consumption for the input receiver 20.

The NFET 14 that dictates the receiver_enable signal can also be divided into a dual pair of NFET transistors, represented by the NFETs 25 and 26 transistors. For the SSTL_3 mode in 3.3 volt operations, NFETs 25 and 26 are both turned ON. The NFET 25 is turned ON by connecting the gate of the NFET 25 to a high receiver_enable signal. To turn ON the NFET 26, the receiver_enable signal is high in a first input of the NAND gate 30, and the SSTL_or_LVTTL signal is high into a second input of the NAND gate 30, which generates a low output signal from the NAND gate 30 into an input of the inverter 31, which in turn generates a high output signal from the inverter 31 to turn ON the NFET 26. For an LVTTL interface, the NFET 25 is turned ON while the NFET 26 is turned OFF. The NFET 25 is turned ON by tying the gate of the NFET 25 to a high receiver_enable signal. The NFET 26 is turned OFF from a SSTL_or_LVTTL signal, which is asserted low into the second input of the NAND gate 30 to generate a high output signal from the NAND gate 30 into the input of the inverter 31. The high output signal from the NAND gate 30 into the input of the inverter 31 generates a low output signal to turn OFF the NFET 26. By turning off NFET 26, the current capacity of the input receiver 20 is reduced and slows the rising edge of the receiver_output signal.

In the actual implementation, an SSTL interface is selected as a benchmark for interfacing with other I/O interfaces since the SSTL interface requires the highest and most rigorous performance among the several types of interfaces. After the sizes of all the transistors have been selected to meet the voltage requirements for an SSTL interface, adjustments are made to an input receiver to operate with other I/O interfaces like a TTL interface. For example, a TTL interface requires a significantly less electrical current than an SSTL interface. By splitting a transistor into multiple transistors, the ratio between the transistor sizes of the divided transistors can be adjusted to limit the flow of the electrical current. Since a TTL interface does not require as much speed as an SSTL interface, the splitting of transistors permits an input receiver to obtain the best TTL performance with the lowest electrical current.

The selection of the type of I/O interface can be implemented in various ways. One approach is to add a pin in the input receiver that connects to an external chip from the input receiver. If the pin detects a high signal, the high signal can be assigned to indicate to an input receiver that the external chip is an SSTL interface. If the pin detects a low signal, then the low signal can be assigned to indicate that the external chip is a TTL interface. Another approach for selecting a type of interface is to wire bond within a semiconductor package. Multiple bonding pads facilitate an input receiver to wire bond to an SSTL interface or to wire bond to a TTL interface.

While the preferred embodiment of the invention has been illustrated and described, it will be appreciated that various changes can be made therein without departing from the spirit and scope of the invention. For example, each of the transistors 13 and 15 in the input receiver 10 can be further subdivided to two or more transistors for accommodating various I/O level interfaces with different input high signal and input low signal requirements. The receiver_enable signal is typically a logic signal, but the receiver_enable signal can also be connected to a Vdd supply voltage. The transmission gates used in FIG. 4 can be designed using full CMOS pass gates as shown in FIG. 4, or the transmission gates can be designed using single FET devices.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An input receiver, comprising:
    a differential amplifier in normal mode, comprising:
        a plurality of bias transistors configured to bias the differential amplifier;
        a first pair of transistors configured to receive a first and second reference voltage signals, a first reference voltage signal being at an intermediate level for the input receiver to interface with a first interface, a second reference voltage signal being at an intermediate level for the input receiver to interface with a second interface; and
        a second pair of transistors configured to receive an enable signal and an interface select signal, the enable signal being at a high level for enabling the input receiver, the interface select signal selecting a first state for interfacing with the first interface and selecting a second state for interfacing with the second interface.

2. The input receiver of claim 1 wherein the first interface has a first predetermined input high voltage signal and a first predetermined input low voltage signal.

3. The input receiver of claim 2 wherein the second interface has a second predetermined input high voltage signal and a second predetermined input low voltage signal.

4. The input receiver of claim 3 wherein the plurality of bias transistors comprise:
    a first transistor having a first terminal connected to a Vdd line, a second terminal, and a third terminal connected to the second terminal;
    a second transistor having a first terminal connected to the Vdd line, a second terminal connected to the second and third terminals of the first transistor, and a third terminal; and
    a third transistor having a first terminal, a second terminal, and a third terminal, the first terminal of the third transistor being connected to the second and third terminals of the first transistor and the second terminal of the second transistor.

5. The input receiver of claim 4 wherein the first pair of transistors comprise:
    a fourth transistor having a first terminal, a second terminal, and a third terminal, the first terminal being connected to the second and third terminals of the first transistor and the second terminal of the second transistor; and
    a fifth transistor having a first terminal, a second terminal configured to receive the enable signal, and a third terminal connected to a ground line.

6. The input receiver of claim 5 wherein the second pair of transistors comprise:
    a sixth transistor having a first terminal, a second terminal configured to receive a second enable signal, and a third terminal connected to the third terminal of the fifth transistor and the ground; and
    a seventh transistor having a first terminal, a second terminal configured to receive an input signal, and a third terminal connected to the third terminal of the second transistor, the first terminal being connected to the third terminal of the third transistor, the third terminal of the fourth transistor, the first terminal of the fifth transistor, and the first terminal of the sixth transistor.

7. The input receiver of claim 6 wherein the first interface comprises an stub series terminated logic (SSTL) interface, the first predetermined input high voltage setting at a reference voltage +200 mv, the first predetermined input low voltage setting at the reference voltage −200 mv, the third and fourth transistors being turned to an ON state, the fifth and sixth transistors being turned to an ON state.

8. The input receiver of claim 6 wherein the second interface comprises a low voltage transistor-transistor logic (LVTTL) interface, the second predetermined input high voltage setting at 2.0 volts, the second predetermined input low voltage setting at 0.8 volt, the third transistor being turned to an OFF state, the fourth transistor being turned to an ON state, the fifth transistor being turned to an ON state, and the sixth transistor being turned to an OFF state.

9. The input receiver of claim 6 further comprising a third interface having a third predetermined input high voltage signal and a third predetermined input low voltage signal, the first and second means being adjusted to interface with third predetermined input high and input low voltage signals of the third interface, the third interface including a TTL interface.

10. An input receiver, comprising:
    first means for receiving first and second reference voltage signals, the first reference voltage signal being high to the first means for interfacing with a first interface if the input receiver interfaces with the first interface, the second reference voltage signal being high to the first means for interfacing with a second interface if the input receiver interfaces with the second interface, the first interface having a first predetermined input high voltage signal and a first predetermined input low voltage signal, the second interface having a second predetermined input high voltage signal and a second predetermined input low voltage signal; and
    second means, operatively connected to reference voltage signals means, for receiving an enable signal and an interface select signal, the enable signal being at a high level to the second means for enabling the input receiver during normal operation, the interface select signal selecting a first state if the input receiver interfaces with the first interface and selecting a second state if the input receiver interfaces with the second interface.

11. The input receiver of claim 10 wherein the first and second means comprise:
    a first transistor having a first terminal connected to a Vdd line, a second terminal, and a third terminal connected to the second terminal;

a second transistor having a first terminal connected to the Vdd line, a second terminal connected to the second and third terminals of the first transistor, and a third terminal;

a third transistor having a first terminal, a second terminal, and a third terminal, the first terminal of the third transistor being connected to the second and third terminals of the first transistor and the second terminal of the second transistor;

a fourth transistor having a first terminal, a second terminal, and a third terminal, the first terminal being connected to the second and third terminals of the first transistor and the second terminal of the second transistor;

a fifth transistor having a first terminal, a second terminal configured to receive the enable signal, and a third terminal connected to a ground;

a sixth transistor having a first terminal, a second terminal configured to receive a second enable signal, and a third terminal connected to the third terminal of the fifth transistor and the ground; and a seventh transistor having a first terminal, a second terminal configured to receive an input signal, and a third terminal connected to the third terminal of the second transistor, the first terminal being connected to the third terminal of the third transistor, the third terminal of the fourth transistor, the first terminal of the fifth transistor, and the first terminal of the sixth transistor.

12. The input receiver of claim 11 wherein:

for interfacing with an SSTL interface, the third and fourth transistors are turned ON; and the fifth and sixth transistors are turned ON.

13. The input receiver of claim 12 wherein the LVTTL interface having an input high signal at 2.0 volts and an input low signal at 0.8 volt, the first interface having a switching point near a center between the input high and input low signals.

14. The input receiver of claim 13 wherein:

for interfacing with an LVTTL interface, the third transistor is turned OFF and the fourth transistor is turned ON; and the fifth transistor is turned ON and the sixth transistor is turned OFF.

15. The input receiver of claim 14 wherein the STTL interface having an input high signal at (0.45*Vdd+200 mv) and an input low signal at (0.45*Vdd−200 mv), the second interface having a switching point near a (0.45*Vdd) voltage.

16. The input receiver of claim 11 further comprising a third interface for interfacing with a TTL interface.

17. An input receiver for communicating with an interface, comprises:

a first transistor having a first terminal configured to receive a Vdd voltage, a second terminal, and a third terminal;

a second transistor having a first terminal connected to receive the Vdd voltage, a second terminal connected to the second and third terminals of the first transistor, and a third terminal;

a third transistor having a first terminal connected to the second and third terminals of the first transistor, a second terminal configured to receive a reference signal, and a third terminal;

a fourth transistor having a first terminal, a second terminal configured to receive an enable signal, and a third terminal connected to a ground line; and a fifth transistor having a first terminal connected to the third terminal of the third transistor and the first terminal of the fourth transistor, a second terminal configured to receive an input signal, and a third terminal connected to the third terminal of the second transistor;

wherein the third and fourth transistors are selected to a respective transistor size operable with an input high signal and an input low signal of the interface, the third and fourth transistors being turned ON to operate with the interface, the input receiver being selectively configured to operate with a selected interface type by the reference and enable signals' levels.

18. The input receiver of claim 17 wherein the interface comprises an LVTTL interface having the input high signal at 2.0 volts and the input low signal at 0.8 volt, the first interface having a switching point near a center for the input high and input low signals.

19. The input receiver of claim 17 wherein the interface comprises an SSTL interface having the input high signal at (0.45*Vdd+200 mv) and the input low signal at (0.45*Vdd−200 mv), the second interface having a switching point near a (0.45*Vdd) voltage.

20. The input receiver of claim 17 wherein the interface comprises a TTL interface having the input high signal at 2.4 volts and the input low signal at 0.8 volt.

21. An input receiver comprising:

an interface select circuit, the interface select circuit being configured to receive an interface select signal and an enable signal, a first reference voltage signal and a second reference voltage signal, wherein the interface select circuit is configured to output a second enable signal as a function of the interface select and enable signals and to selectively output the first and second reference voltage signals as a function of the interface select signal;

reference voltage receiving circuit coupled to the reference voltage receiving circuit, the reference voltage receiving circuit being configured to receive the second enable signal and the first and second reference voltage signals, wherein the input receiver is configured to operate with a first interface and with a second interface as a function of the first and second reference signals, wherein the first interface has a first predetermined input high voltage signal and a first predetermined input low voltage signal, and wherein the second interface has a second predetermined input high voltage signal and a second predetermined input low voltage signal; and an enable circuit coupled to the reference voltage receiving circuit, wherein the interface select circuit is configured to receive the enable signal and an input signal, wherein the input receiver is configured to be enabled in response to a logic level of the enable signal and to provide an output signal as a function of the input signal's logic level.

22. The input receiver of claim 21 wherein the reference voltage receiving circuit comprises:

a first transistor having a first terminal connected to a Vdd line, a second terminal, and a third terminal connected to the second terminal;

a second transistor having a first terminal connected to the Vdd line, a second terminal connected to the second and third terminals of the first transistor, and a third terminal;

a third transistor having a first terminal, a second terminal, and a third terminal, the first terminal of the third transistor being connected to the second and third terminals of the first transistor and the second terminal of the second transistor; and a fourth transistor having a first terminal, a second terminal, and a third terminal, the first terminal being connected to the second and third terminals of the first transistor and the second terminal of the second transistor.

23. The input receiver of claim 22 wherein the enable circuit comprises:

a fifth transistor having a first terminal, a second terminal configured to receive the enable signal, and a third terminal connected to a ground line;

a sixth transistor having a first terminal, a second terminal configured to receive a second enable signal, and a third terminal connected to the third terminal of the first transistor and the ground; and a seventh transistor having a first terminal a second terminal configured to receive an input signal, and a third terminal connected to third terminal of the second transistor the first terminal being connected to the third terminal of the third transistor, the third terminal of the forth transistor, the first terminal of the fifth transistor, and the first terminal of the sixth transistor.

24. The input receiver of claim 21 wherein the interface select circuit comprises a multiplexer and a logic circuit.

25. The input receiver of claim 21 further comprising an inverter coupled to the enable circuit, the inverter being configured to output the output signal.

* * * * *